US011901274B2

(12) United States Patent
Liu et al.

(10) Patent No.: US 11,901,274 B2
(45) Date of Patent: Feb. 13, 2024

(54) PACKAGED INTEGRATED CIRCUIT DEVICE WITH RECESS STRUCTURE

(71) Applicant: Intel Corporation, Santa Clara, CA (US)

(72) Inventors: Bin Liu, Shanghai (CN); John G. Meyers, Sacramento, CA (US); Florence R. Pon, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 189 days.

(21) Appl. No.: 15/752,240

(22) PCT Filed: Sep. 25, 2015

(86) PCT No.: PCT/CN2015/090728
§ 371 (c)(1),
(2) Date: Feb. 12, 2018

(87) PCT Pub. No.: WO2017/049587
PCT Pub. Date: Mar. 30, 2017

(65) Prior Publication Data
US 2020/0066621 A1  Feb. 27, 2020

(51) Int. Cl.
*H01L 23/498* (2006.01)
*H01L 23/13* (2006.01)
(Continued)

(52) U.S. Cl.
CPC ........ *H01L 23/49816* (2013.01); *H01L 23/13* (2013.01); *H01L 23/5386* (2013.01);
(Continued)

(58) Field of Classification Search
CPC ........... H01L 23/49816; H01L 23/5386; H01L 25/0657; H01L 23/13; H01L 25/105; H01L 25/50
(Continued)

(56) References Cited

U.S. PATENT DOCUMENTS

| 8,822,268 B1* | 9/2014 | Magnus | H01L 23/5383 438/107 |
| 2004/0106229 A1* | 6/2004 | Jiang | H01L 23/3128 438/106 |

(Continued)

FOREIGN PATENT DOCUMENTS

| TW | 200921891 | 5/2009 |
| TW | 201110245 | 3/2011 |

(Continued)

OTHER PUBLICATIONS

International Search Report and Written Opinion for International Patent Application No. PCT/CN2015/090728 dated Jun. 27, 2016, 9 pgs.

(Continued)

*Primary Examiner* — Lex H Malsawma
*Assistant Examiner* — Eric W Jones
(74) *Attorney, Agent, or Firm* — Schwabe, Williamson & Wyatt, P.C.

(57) ABSTRACT

A packaged device (110) includes a substrate (114) and one or more contacts (118) disposed on a side of the substrate (114). Structures of the packaged device (110) define at least in part a recess region (120) that extends from the side of the substrate (114) and through the substrate (114), where one or more contacts (124) of a second hardware interface are disposed in the recess region (120). The one or more contacts (118) of the first hardware interface enable connection of the packaged device (110) to a printed circuit board. The one or more contacts (124) of the second hardware interface enable connection between one or more IC dies of the packaged device (110) and another IC die (150) that is a component of the packaged device (110) or of a different packaged device.

20 Claims, 12 Drawing Sheets

(51) Int. Cl.
*H01L 23/538* (2006.01)
*H01L 25/065* (2023.01)
*H01L 25/10* (2006.01)
*H01L 25/00* (2006.01)

(52) U.S. Cl.
CPC ........ *H01L 25/0657* (2013.01); *H01L 25/105* (2013.01); *H01L 25/50* (2013.01)

(58) Field of Classification Search
USPC .......................................................... 257/668
See application file for complete search history.

(56) References Cited

U.S. PATENT DOCUMENTS

| | | |
|---|---|---|
| 2006/0175696 A1 | 8/2006 | Kim |
| 2007/0200230 A1 | 8/2007 | Chow et al. |
| 2007/0289127 A1* | 12/2007 | Hurwitz .............. H01L 21/4857 |
| | | 257/E23.005 |
| 2011/0024888 A1 | 2/2011 | Pagaila et al. |
| 2011/0068444 A1* | 3/2011 | Chi ....................... H01L 23/552 |
| | | 257/E21.705 |
| 2011/0210444 A1* | 9/2011 | Jeng ......................... H01L 23/13 |
| | | 257/738 |
| 2014/0185264 A1* | 7/2014 | Chen .................... H01L 23/3128 |
| | | 361/814 |
| 2015/0235936 A1* | 8/2015 | Yu ............................ H01L 23/36 |
| | | 257/737 |

FOREIGN PATENT DOCUMENTS

| | | |
|---|---|---|
| TW | 201118963 | 6/2011 |
| TW | 201131696 | 9/2011 |
| TW | 201208024 | 2/2012 |
| TW | 201324708 | 6/2013 |
| TW | 201532234 | 8/2015 |
| TW | 200921891 | 5/2019 |

OTHER PUBLICATIONS

International Preliminary Search Report for PCT/CN2015/090728 dated Apr. 5, 2018, 7 pages.
Office Action from Taiwan Patent Application No. 105125144, dated Jan. 2, 2020, 9 pages.
Office Action from Taiwan Patent Application No. 105125144, dated Aug. 28, 2020, 4 pages.
Notice of Allowance from Taiwan Patent Application No. 105125144, dated Jun. 7, 2021, 3 pages.

* cited by examiner

PACKAGED INTEGRATED CIRCUIT DEVICE WITH RECESS STRUCTURE

CROSS-REFERENCE TO RELATED APPLICATION

This patent application is a U.S. National Phase Application under 35 U.S.C. § 371 of International Application No. PCT/CN2015/090728, filed Sep. 25, 2015, entitled "PACKAGED INTEGRATED CIRCUIT DEVICE WITH RECESS STRUCTURE," which designates the United States of America, the entire disclosure of which is hereby incorporated by reference in its entirety and for all purposes.

BACKGROUND

1. Technical Field

Embodiments discussed herein relate generally to packaged integrated circuit (IC) devices and more particularly, but not exclusively, to structures for providing connection to circuitry of a packaged IC device.

2. Background Art

Mobile, tablet, and ultrabook technologies require semiconductor device packages with increasingly reduced dimensions, also known as a small form factor. Package technologies have been developed to incorporate multiple components into a single package to reduce the system board space (x-y dimension) and board mounted height ("z-height"). Packages may include a package substrate, one or more integrated circuit (IC) dies, various other active and/or passive components, and encapsulation that may all contribute to the package x-y dimensions and z-height and limit the degree to which the package form factor can be reduced.

As various packaging technologies approach the lower limits of their respective form factors, there is an increasing demand for solutions that provide for incremental improvements in the efficiency of space taken up by packaged IC devices.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide techniques and/or mechanisms to facilitate operation of one or more integrated circuit (IC) dies of a packaged device with one or more other IC die that are included in or are to couple to the packaged device. A packaged device according to one embodiment includes a recess structure that is formed at least in part by, or can accommodate, a multi-level arrangement of substrate structures. The recess structure may receive a unit comprising one or more IC dies—e.g., where the unit is a component of the packaged device or is another packaged device. In an embodiment, the recess structure allows for the unit to be suspended at least partially under a side of the packaged device while the packaged device is coupled to a printed circuit board (PCB) or other device. As compared with existing packaging technologies, certain embodiments provide for an improved z-height profile of hardware including multiple IC dies.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including one or more packaged IC devices.

Figure 1:
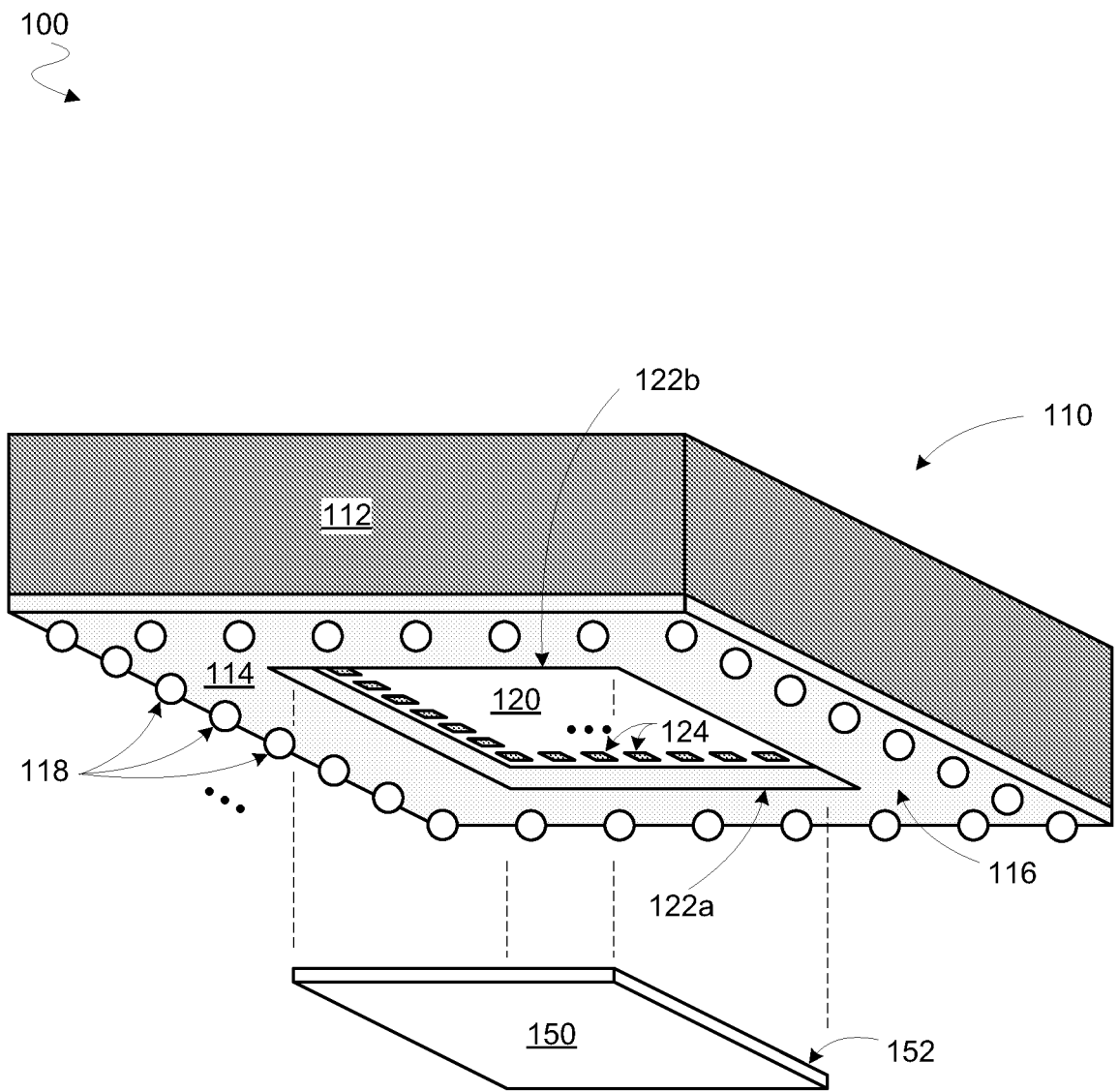
FIG. 1 is a perspective view of a system for providing connection to a packaged IC die according to an embodiment.

FIG. 1 is an exploded view illustrating elements of a system 100 to provide access to one or more packaged IC die according to an embodiment. System 100 may include a processing-capable platform or operate as a component of such a platform. For example, system 100 may include any of a variety of packaged devices that are to provide functionality of a processor, a memory subsystem, a system-in-package and/or the like.

In an embodiment, system 100 includes an assembly 110 comprising a package material 112 having disposed therein one or more IC dies (not shown). Package material 112 may include any of a variety of materials known in the art for packaging integrated circuitry. Examples of such materials include, but are not limited to, an epoxy, polymer, resin, plastic, ceramic, etc.

The one or more IC dies disposed in package material 112 may include, for example, a NAND memory die and/or any of a variety of other memory die. Additionally or alternatively, such one or more IC dies may include a processor die, an application specific integrated circuit (ASIC), a system-on-chip and/or any of various other IC die. However, some embodiments are not limited with respect to the particular type and/or number of dies disposed in package material 112 or otherwise included in system 100.

Assembly 110 may further comprise a substrate 114 disposed in or on package material 112, the substrate 114 including structures coupled to enable access to the one or more IC dies of assembly 110. Substrate 114 may include an interposer or any of a variety of other such structures to enable functionality such as that adapted from conventional package technologies. By way of illustration and not limitation, substrate 114 may have formed therein one or more vias, traces or other structures to allow for communicative coupling between assembly 110 and other hardware that is included in system 100 or is to couple to system 100. Although certain embodiments are not limited in this regard, substrate 114 may provide for a fanout of interconnects having a relatively large pitch at a side 116 of substrate 114, as compared to a corresponding pitch of such interconnects at an opposite side (not shown) of substrate 114.

In the illustrative embodiment shown, side 116 has formed thereon one or more contacts 118 (e.g. one or more conductive pins, pads, balls and/or other such connection hardware) of a first hardware interface that is to enable coupling of assembly 110 to some other device (not shown) such as a printed circuit board (PCB) or a packaged device. The one or more contacts 118 may be coupled to enable delivery of data, control signaling, address signaling, clock signaling, power, a reference potential (e.g., ground) and/or any of a variety of other exchanges. The hardware interface including one or more contacts 118 may include a ball grid array, for example. The particular number and arrangement of contacts 118 (and/or other hardware interface contacts illustrated herein) is merely illustrative, and may vary according to different embodiments having more, fewer and/or differently arranged contacts.

In an embodiment, assembly 110 further comprises another interface that, for example, is to enable coupling of assembly 110 to a device other than that which may couple to assembly 110 via the interface including one or more contacts 118. This other hardware interface may include one or more contacts that are recessed from a plane of side 116. By way of illustration and not limitation, this other hardware interface may comprise one or more contacts 124 disposed in a recess structure 120 formed in assembly 110. For example, edges 122a, 122b of side 116 may define at least in part opposing sidewalls of recess structure 120, where such sidewalls extend from side 116 through to an opposite side (not shown) of substrate 114. In the illustrative embodiment shown, recess structure 120 includes a hole that extends at least through substrate 114. In some embodiments, recess structure 120 may further extend through one or more structures (not shown) that are disposed in package material 112 and are coupled to the opposite side of substrate 114.

Recess structure 120 may accommodate insertion of additional hardware—e.g., the illustrative unit 150 of system 100—that includes one or more IC dies (not shown). For example, such one or more IC dies of unit 150 may be coupled directly or indirectly to the one or more contacts 124 by other contacts (not shown) that are in or on a side 152 of unit 150. The one or more IC dies of unit 150 may include a processor chip, memory chip, ASIC, system-on-chip and/or any of various other types of IC dies, according to different embodiments. In one embodiment, assembly 110 is a first packaged device and unit 150 is another packaged device. Alternatively, unit 150 may be a component—e.g., including a yet-to-be packaged die, die stack, etc.—that is to be packaged with assembly 110 to form a single packaged device such as a package-in-package.

As disclosed herein, recess structure 120 may allow for system 100 to exhibit improved z-height characteristics, as compared to existing packaging technologies. For example, recess structure 120 may allow for at least a part of unit 150 to be positioned "below" side 116—e.g., in a region between side 116 and another device (not shown) that is to couple to assembly 110 via one or more contacts 118. In enabling circuitry and/or other structure to be so positioned below side 116, various embodiments allow for package material 112 and/or circuitry disposed in package material 112 to have a lower z-height design, as compared to designs allowed according to existing techniques.

Figure 2:
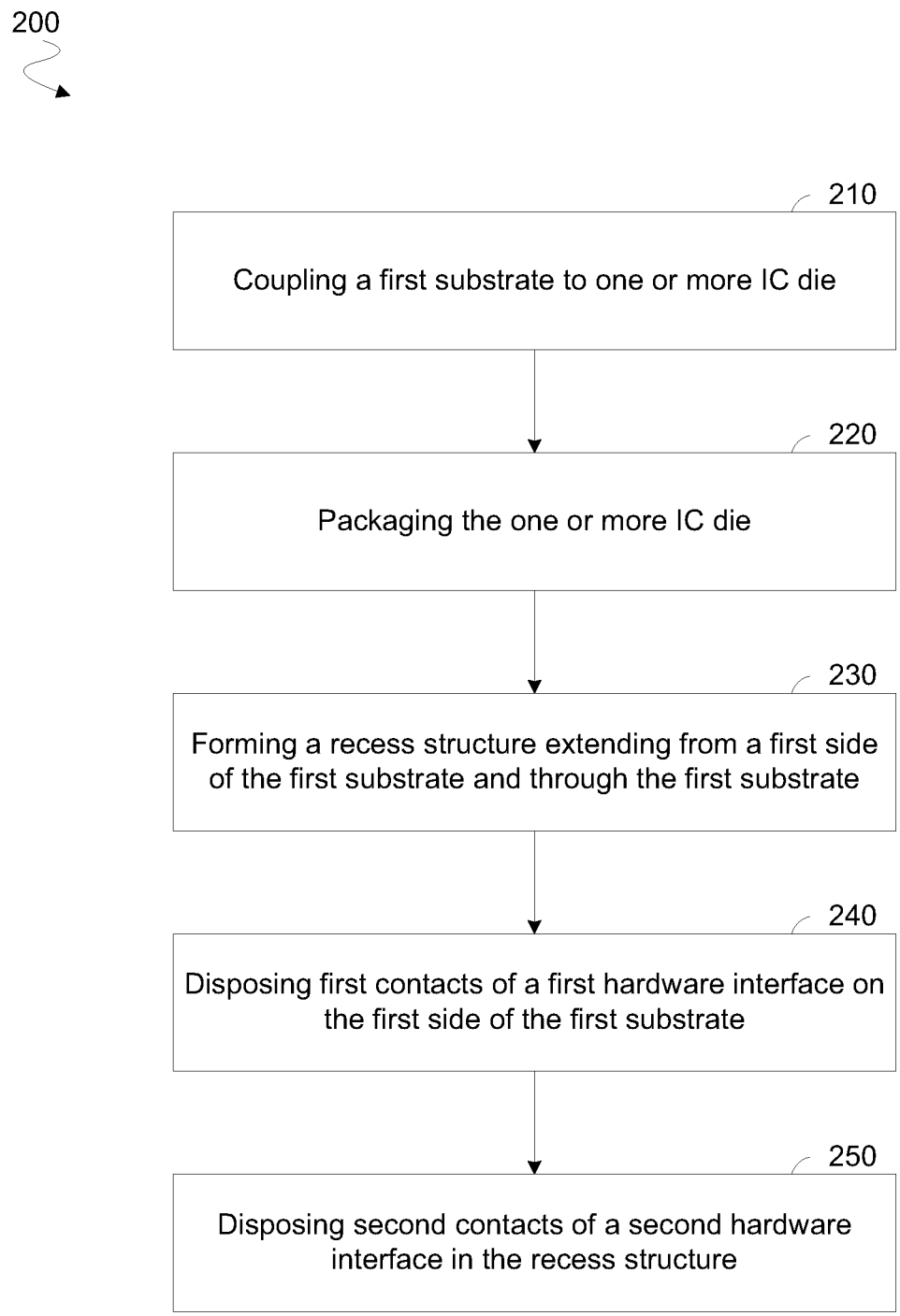
FIG. 2 is a flow diagram illustrating elements of a method for fabricating a packaged device according to an embodiment.

FIG. 2 illustrates elements of a method 200 for manufacturing a device including packaged circuitry according to an embodiment. Performance of method 200 may fabricate a device having some or all of the features of assembly 110, for example. In some embodiments, method 200 produces system 100 or other such hardware having features disclosed herein.

Method 200 may include, at 210, coupling a first substrate to one or more IC die. For example, the coupling at 210 may comprise wire bonding or otherwise coupling substrate 114 to an IC die that is included in, or is to be included in, package material 112. The first substrate may include an interposer that is to enable connection of the one or more IC dies to other integrated circuitry that is to be included in, or may be coupled to, the final packaged device. The first substrate may additionally or alternatively form a hole or notch structure that extends from a plane including a side of the substrate.

In an embodiment, method 200 further comprises, at 220, packaging the one or more IC dies in a package material. The packaging at 220 may include injection molding or otherwise disposing the package material around the one or more IC dies and, in an embodiment, on the first substrate. Although some embodiments are not limited in this regard, the first substrate may be disposed within the package material after the packaging at 220.

Method 200 may further include, at 230, forming a recess structure extending from a first side of the first substrate and through the first substrate. The recess structure may be defined at least in part by sidewall structures of the first substrate—e.g., where such sidewall structures include opposing sidewalls of the first substrate that face one another. In one embodiment, the recess structure is formed at least in part by sidewalls of the first substrate—e.g., wherein the sidewalls define an opening that is 3 millimeters (mm) or more in width and/or in length. However, such dimensions are merely illustrative, and may vary significantly in different embodiments according to implementation-specific details. In an embodiment, a cross-sectional area of the recess structure is greater than a cross-sectional area of another IC die that is to couple to the one or more IC die via structures disposed in the recess structure.

The forming at 230 may include one or more operations adapted from any of a variety of conventional masking, drilling cutting and/or other techniques. By way of illustration and not limitation, the forming at 230 may include disposing a cover structure that extends through a hole that is formed in the first substrate or, alternatively, into a notch that is formed in the first substrate. The cover structure may prevent package material from being injection molded or otherwise disposed into a region that is to become a recess that extends into (e.g., through) the substrate. After the package material is disposed around the one or more IC dies at 220, the cover structure may be cut, drilled, ground or otherwise removed to expose the recess structure. In another embodiment, forming the recess structure at 230 includes drilling or otherwise removing package material disposed in a hole or notch that is formed by the first substrate.

Method 200 may further comprise, at 240, disposing first contacts (e.g., the one or more contacts 118) of a first hardware interface on the first side of the first substrate. The first hardware interface may enable coupling of a device manufactured by method 200 to a printed circuit board or, alternatively, to another packaged device. In an embodiment, method 200 further includes, at 250, disposing second contacts (e.g., the one or more contacts 124) of a second hardware interface in the recess structure. The second contacts may enable coupling to one or more other IC die (e.g., other than the die or dies coupled to the first substrate at 210). The disposing at 240 and/or the disposing at 250 may include mask, deposition, etch, solder and/or other operations adapted from any of a variety of conventional techniques for forming conductive contacts of a packaged device. In one embodiment, one or more of the second contacts are disposed at 250 on a floor of the recess structure. Alternatively or in addition, one or more of the second contacts may be disposed at 250 on a sidewall of the recess structure. The disposing at 240 and/or the disposing at 250 may include forming contacts of a ball grid array or other interface hardware. In some embodiments, the packaging at 220 is performed after the disposing at 240 and/or the disposing at 250.

Although certain embodiments are not limited in this regard, method 200 may further comprise one or more other operations (not shown) to couple a packaged device to one or more other devices—e.g., where the packaged device includes the first substrate, the one or more IC dies, the first contacts and the second contacts. For example, the packaged device may be soldered or otherwise coupled to a printed circuit board or another packaged device via the first contacts of the first hardware interface. Alternatively or in addition, the packaged device may be coupled to another packaged device via the second contacts of the second hardware interface. The packaging at 220 may be performed, for example, after such coupling with the other packaged device. In some embodiments, method 200 further comprises one or more other operations (not shown) to package a device including the first substrate, the one or more IC dies, the first contacts and the second contacts, and another IC die coupled to the one or more IC dies via the second contacts.

Figure 3:
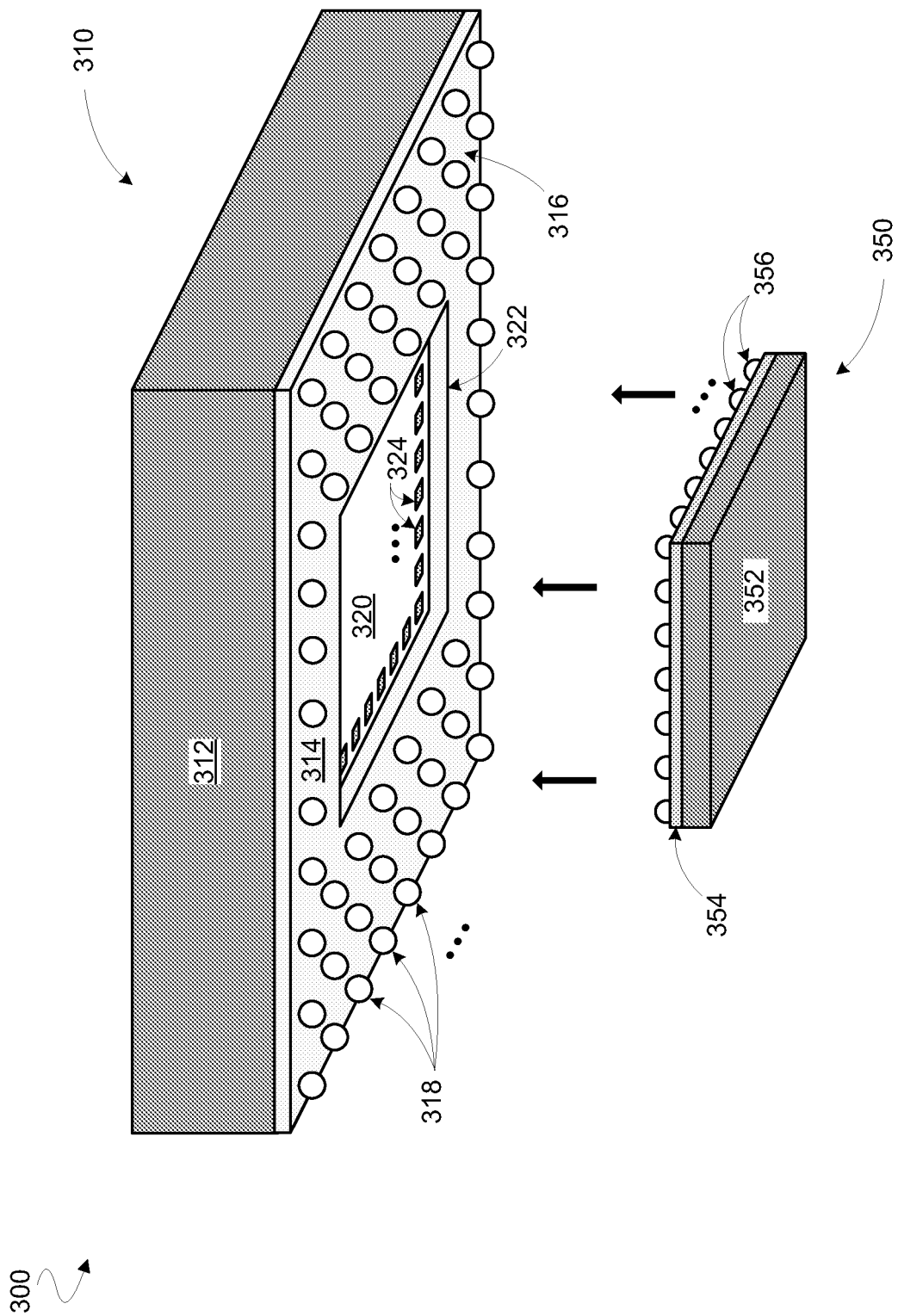
FIG. 3 is a perspective view of a system for providing connection between packaged devices according to an embodiment.

FIG. 3 is an assembly view of a system 300 to provide access to one or more packaged IC die according to an embodiment. System 300 may include some or all of the features of system 100, for example. System 300 includes a packaged device 310 and another packaged device 350 to couple to packaged device 300. Packaged devices 310, 350 may correspond functionally to assembly 110 and unit 150, respectively. Some embodiments are implemented entirely by a packaged device having, for example, some of all features of packaged device 310 or assembly 110.

In the illustrative embodiment shown, packaged device 310 includes a substrate 314 and a package material 312 having one or more IC dies (not shown) disposed therein. Substrate 314 and package material 312 may correspond functionally to substrate 114 and a package material 112, respectively. A side 316 of substrate 314 may have formed thereon one or more contacts 318 of a hardware interface that is to enable coupling of packaged device 310 to some other device (not shown) such as a PCB or a packaged device. The one or more contacts 318 may form at least part of a ball grid array, for example.

Packaged device 310 may further comprise another interface that is to enable coupling of packaged device 310 to packaged device 350. By way of illustration and not limitation, this other hardware interface may comprise one or more contacts 324 disposed in a recess structure 320 formed in packaged device 310. Side 316 may form an edge of a hole that extends through (or alternatively, of a notch that extends into) substrate 314 to form at least part of recess structure 320. In the illustrative embodiment shown, an edge 322 of side 316 defines at least in part a perimeter of a hole that extends from a plane of side 316 and through substrate 314.

As illustrated in FIG. 3, packaged device 350 may include a substrate 354—e.g., an interposer—and contacts 356 disposed thereon, where the contacts 356 are to couple to one or more contacts 324. Such connection may facilitate operation of the one or more IC dies of packaged device 310 with one or more other IC die disposed in package material 352. In an illustrative embodiment, one of packaged devices 310, 350 includes one or more memory dies (e.g., NAND memory dies), where the other of packaged devices 310, 350 includes an ASIC or other IC die including memory controller circuitry to control operation of the one or more memory dies. However, any of a variety of additional or alternative types of dies may be variously distributed in packaged devices 310, 350, according to different embodiments.

Figure 4A:
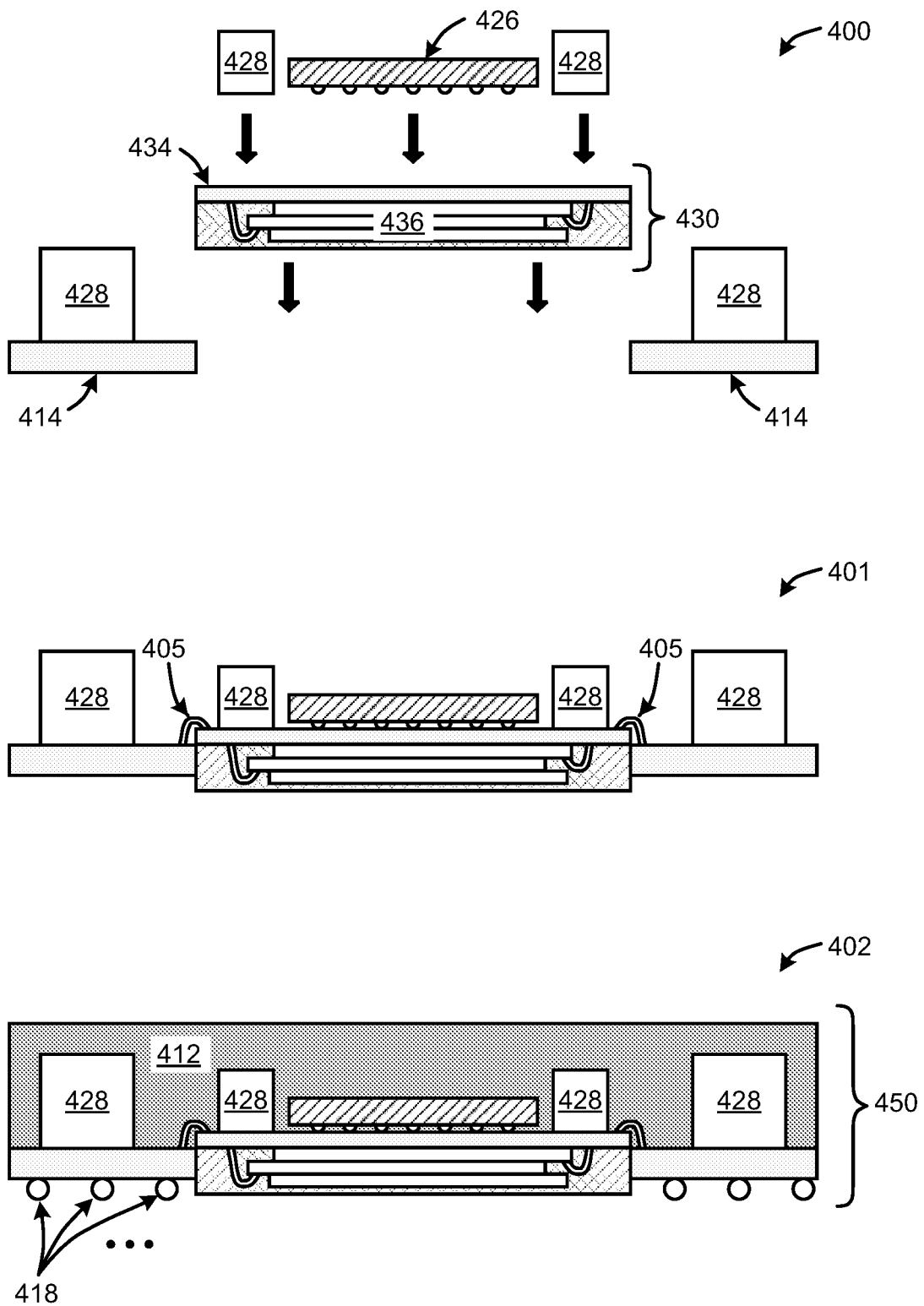
FIGS. 4A, 4B shows cross-sectional views illustrating operations to fabricate a packaged device according to an embodiment.
Figure 4B:
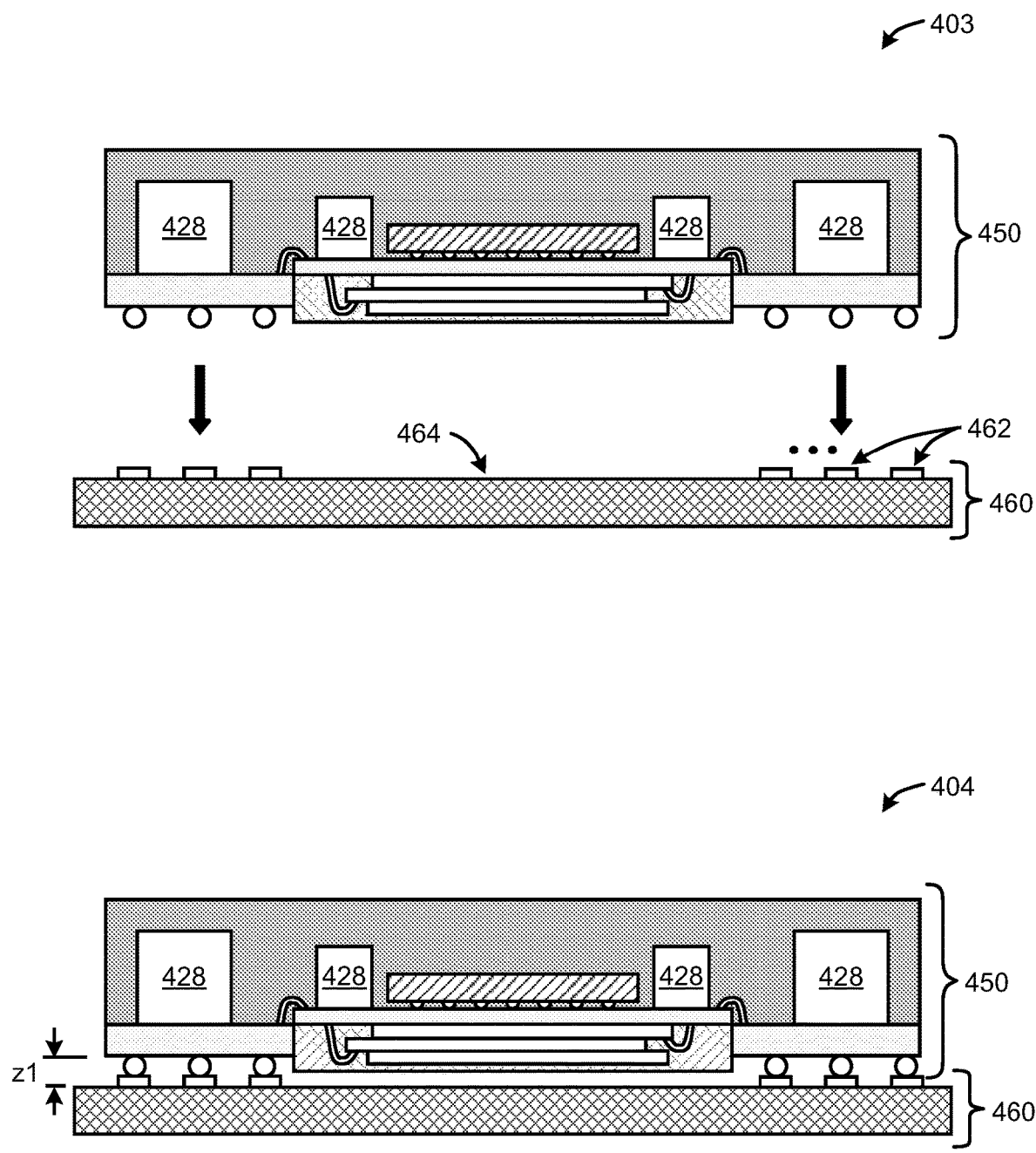

FIGS. 4A, 4B show, in cross-sectional view, various stages 400-404 of processing to couple one or more IC dies of a packaged device according to an embodiment. Such processing may fabricate a device including features such as those of assembly 110, device 310 and/or the like. In an embodiment, stages 400-404 include one or more operations of method 200.

In the illustrative embodiment shown, such processing may include disposing a packaged device 430 in by structures that are to form a recess of a larger packaged device 450 that is to include packaged device 430. Although certain embodiments are not limited in this regard, such processing may further comprise coupling the resulting packaged device 450 to a PCB 460 (or, alternatively, to another packaged device). In an embodiment, packaged device 450 includes some or all of the features of packaged device 310—e.g., where packaged device 430 includes some or all of the features of packaged device 350, for example.

As shown in the cross-sectional view of stage 400, packaged device 430 may be inserted into a hole that extends through a substrate 414 (e.g., an interposer). The hole through substrate 414 may ultimately form at least part a recess structure of the finally formed packaged device 450. In the illustrative embodiment shown, packaged device 430 includes one or more dies (as represented by the illustrative IC die stack 436) disposed in a package material. The one or more dies—including multiple NAND memory die, for example—may be wire bonded, flip chip connected or otherwise coupled to a substrate 434 of packaged device 430. Contacts (not shown) disposed in or on substrate 434 may provide for coupling of packaged device 430 to other circuitry that is to be included in packaged device 450. Such coupling may allow for operation of an IC die 426 with packaged device 430—e.g., where IC die 426 includes a controller to provide a host with access to NAND (and/or other) memory resources of die stack 436. Other components 428 to be included in packaged device 450 may also be variously coupled for operation with IC die 426 and packaged device 430—e.g., where such other components 428 include any of a variety of combinations of passive components and/or active components. For example, components 428 may include one or more resistors, capacitors, crystals and/or the like.

In an embodiment, the positioning of packaged device 430 in the hole formed by substrate 414 results in packaged device 430 extending at least partially under substrate 414. After the positioning of packaged device 430 at stage 400, one of more interconnects (such as the illustrative wire bonds 405 shown) may be variously coupled at stage 401 between respective ones of packaged device 430, substrate 414, IC die 426 and components 428. After such interconnection, a package material 412 may be injection molded or otherwise disposed around IC die 426 and other components 428 disposed on the top side of substrate 414. The package material 412 may further be disposed at stage 402 around at least part of packaged device 430 that extends on that top side of substrate 414. One or more contacts 418 may be formed on the bottom side of substrate 414—e.g., after the disposing of package material 412—to enable a subsequent coupling of the resulting packaged device 450 to some other device.

One example, of such subsequent coupling is illustrated by stages 403, 404 of FIG. 4B. At stage 403, packaged device 450 is positioned for one or more contacts 418 to be soldered or otherwise coupled each to a respective one of contacts 462 that are disposed on a side 464 of a PCB 460. As illustrated by stage 404, insertion of packaged device 430 at least partially into the recess region formed with substrate 414 may result in a clearance height z1 that allows for packaged device 430 to be offset from side 464—e.g., where packaged device 430 is suspended at least partially under substrate 414 and above PCB 460. In an embodiment, part of packaged device 430 is closer to side 464 than substrate 414 is to side 464. In accommodating the use of space between substrate 414 (or some other lowest surface extending around packaged device 430) and side 464, certain embodiments allow a design of packaged device 450 that has a relatively low z-height, as compared to other designs according to conventional techniques. For example, offloading of IC stack 436 to packaged device 430 may allow for a total height of package material 412 to be reduced.

Figure 5:
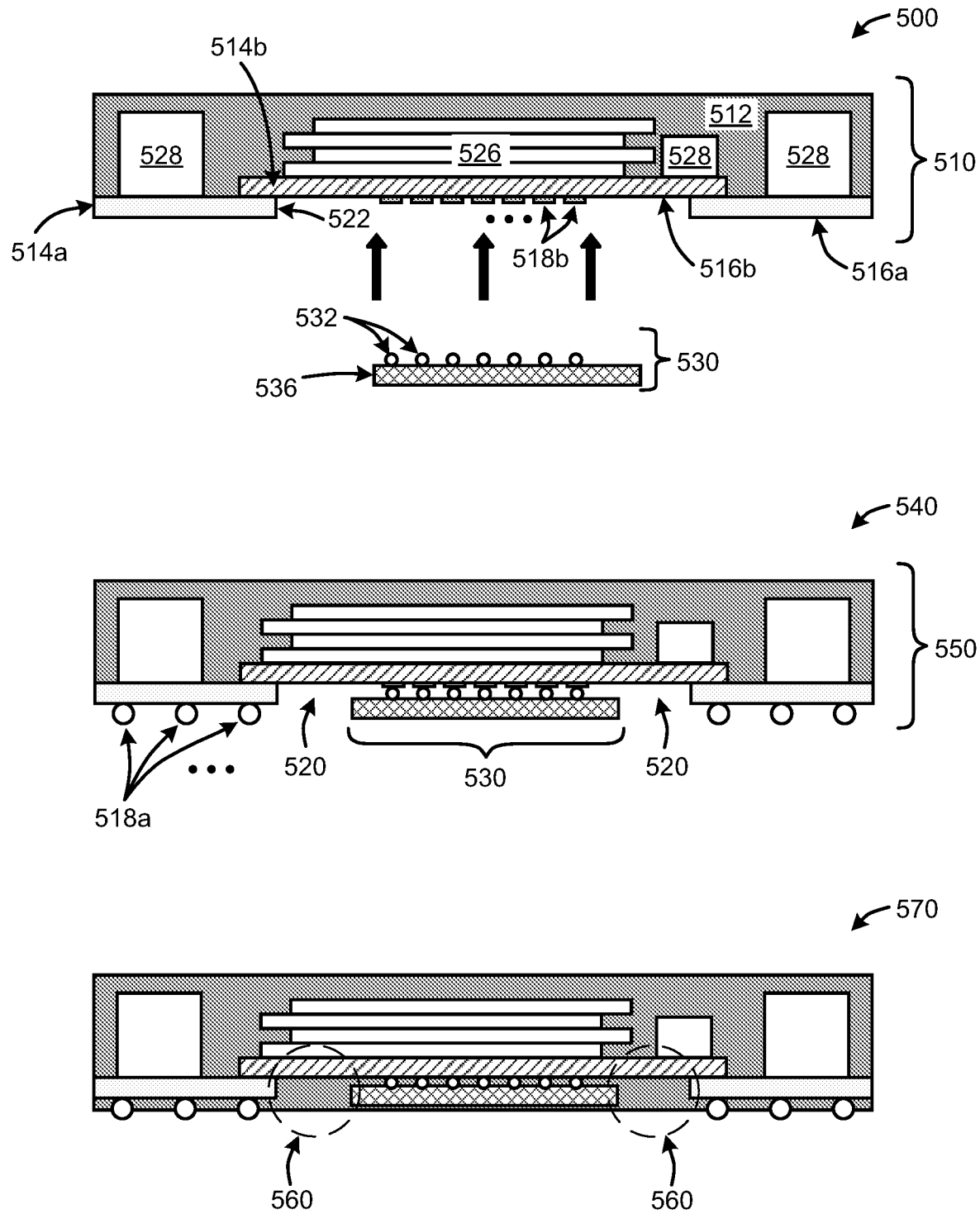
FIG. 5 shows cross-sectional views illustrating operations to fabricate a packaged device according to an embodiment.

FIG. 5 shows in cross-sectional view various stages 500, 540, 570 of processing to fabricate a packaged device according to another embodiment. In the illustrative embodiment shown, such processing may include coupling and packaging of an assembly 510 with a unit 530. Assembly 510 may include some or all of the features of assembly 310—e.g., where unit 530 includes some or all of the features of unit 150.

As illustrated in the cross-sectional view of stage 500, assembly 510 may include a package material 512 and one or more die disposed therein (as represented by the illustrative IC die stack 526). Package material 512 may also have disposed therein other components 528 of assembly 510—e.g., where such other components 528 include features such as those of components 428. Assembly 510 may include structure to aid in connection of assembly 510 to unit 530—e.g., where such structure includes a substrate 514a. One or more contacts 518a of a first hardware interface may be disposed on side 516a of substrate 514a. In one embodiment, assembly 510 further comprises a substrate 514b and one or more contacts 518b of a second hardware interface disposed on side 516b of substrate 514b. Sidewalls 522 of substrate 514a may define at least in part a recess region 520 that extends from side 516 to an opposite side of substrate 514a—e.g., where side 516b extends across or otherwise defines at least in part a bottom (or "floor") side of recess region 520. The multi-level arrangement of substrates 514a, 514b may allow for at least part of unit 530 to be received into recess region 520.

For example, at stage 540, one or more contacts 518b may be soldered or otherwise coupled each to a respective one of contacts 532 of unit 530. The one or more contacts 532 may enable connection of die stack 526 to one or more IC dies of unit 530 (such as the illustrative ASIC 536). In one embodiment, unit 530 includes a substrate (not shown) coupled between one or more contacts 532 and ASIC 536. Alternatively or in addition, unit 530 may further comprise other package material (not shown) disposed around ASIC 536 and/or one or more IC dies of unit 530. Recessing of unit 530 into region 520 may allow for at least some of unit 530 to extend below side 516a. In accommodating the use of space below side 516a for unit 530, certain embodiments allow a design of assembly 510 that has a relatively low z-height, as compared to other designs according to conventional techniques. Although some embodiments are not limited in this regard, some portion of recess region 520 that is not occupied by unit 530 may be subsequently filled with additional package material. For example, as illustrated by stage 570, package material 560 may be further injection molded or otherwise disposed around ASIC 536. In one embodiment, one or more contacts 518a are formed after package material 550 is deposited—e.g., where one or more contacts 518 are formed using through-mold via (TMV) techniques.

Figure 6:
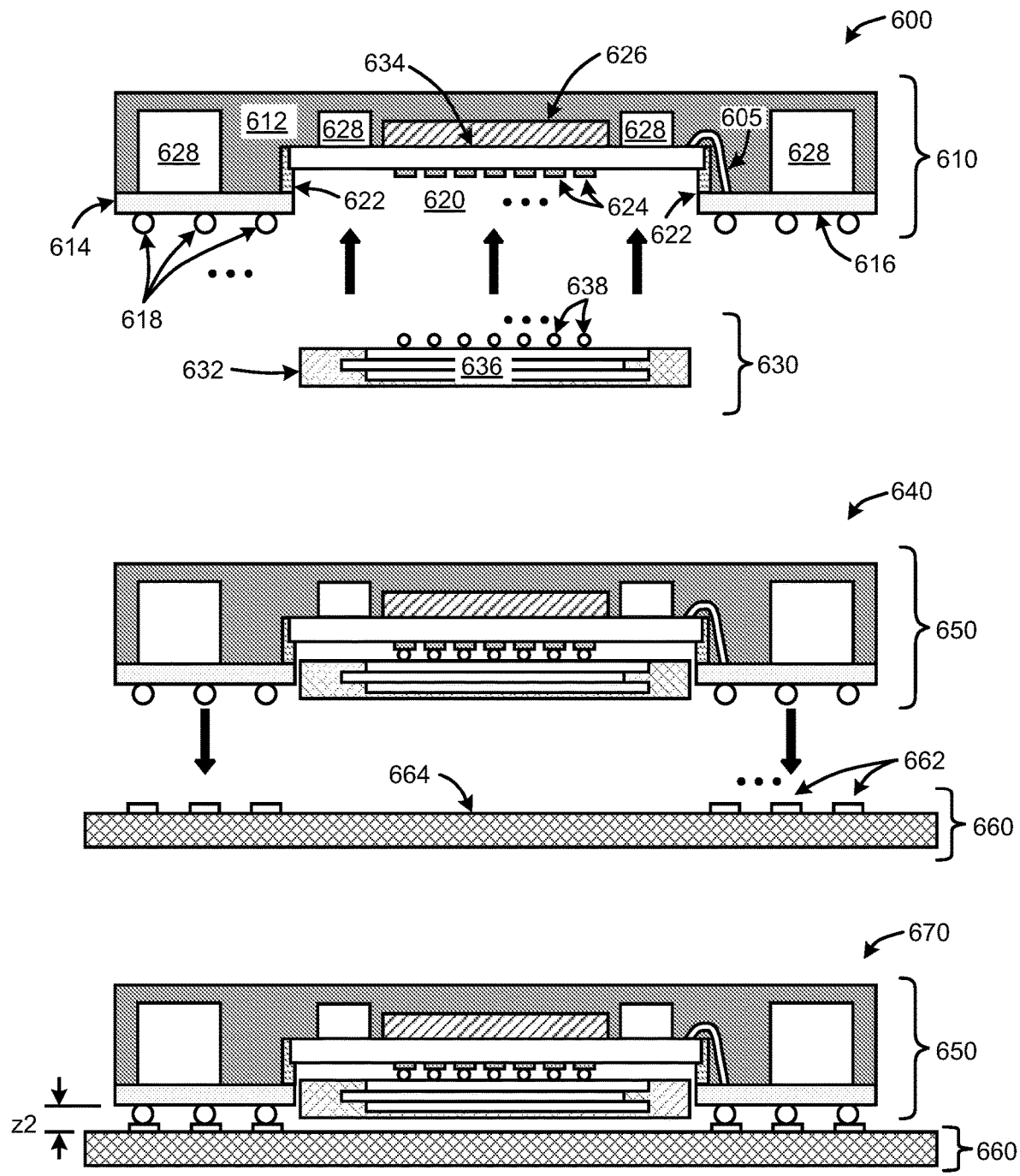
FIG. 6 shows cross-sectional views illustrating operations to connect circuitry of a packaged device according to an embodiment.

FIG. 6 shows in cross-sectional view various stages 600, 640, 670 of assembly processing to couple one or more packaged IC dies according to an embodiment. In the illustrative embodiment shown, such processing may include coupling a packaged device 610 to another packaged device 630 to form an assembly 650. Although certain embodiments are not limited in this regard, such processing may further comprise coupling assembly 650 to a PCB 660 (or, alternatively, to another packaged device). In an embodiment, packaged device 610 includes some or all of the features of packaged device 310—e.g., where packaged device 630 includes some or all of the features of packaged device 350, for example.

As illustrated in the cross-sectional view of stage 600, packaged device 610 may include a package material 612 and an IC die 626 (e.g., including an ASIC) disposed therein. Package material 612 may also have disposed therein other components 628 of packaged device 610—e.g., where such other components 628 include any of a variety of combinations of passive components and/or active components. For example, components 628 may include one or more resistors, capacitors, crystals and/or other such elements. Packaged device 610 may include structure to aid in connection of packaged device 610 to another device such as packaged device 630—e.g., where such structure includes substrates 614, 634 configured in a multi-layer arrangement. One or more contacts 618 of a first hardware interface may be disposed on side 616 of substrate 614. Alternatively or in addition, interconnect structures, such as the illustrative one or more wire bonds 605, may provide for coupling between substrate 614 and one or more components in package material 612.

Structures of packaged device 610 may define a recess region 620 that extends though substrate 614 and, in some embodiments, further extends to substrate 634. During fabrication of packaged device 610, a gasket or other such structure may be disposed between substrates 614, 634 to prevent package material 612 from being deposited into recess region 620. Sidewalls 622 may accommodate insertion of at least part of packaged device 630 into recess region 620. In an embodiment, sidewalls 622 have disposed therein or thereon interconnects structures—e.g., including solder joints, copper bumps, conductive film and/or the like—to provide, in addition to or in lieu of wire bonds 605, for interconnection between substrates 614, 634. The inserted packaged device 630 may be electrically coupled to packaged device 610. In the illustrative embodiment shown, packaged device 630 includes a package material 632 and one or more die (such as the illustrative IC die stack 636) disposed therein. Substrate 634 may have formed thereon one or more contacts 624 to variously couple each to a respective one of one or more contacts 638 in or on a side of packaged device 630. Such coupling may allow for operation of IC die 626 with packaged device 630—e.g., where IC die 626 includes controller logic to operate die stack 636.

At stage 640, assembly 650 may be positioned for one or more contacts 618 to be soldered or otherwise coupled each to a respective one of contacts 662 that are disposed on a side 664 of PCB 660. As illustrated by stage 670, insertion of packaged device 630 at least partially into recess region 620 may result in a clearance height z2 that allows for packaged device 630 to be offset from side 664. In accommodating the use of space between side 616 (or some other lowest surface of packaged device 610) and side 664, certain embodiments allow a design of packaged device 610 that has a relatively low z-height, as compared to other designs according to conventional techniques.

Figure 7:
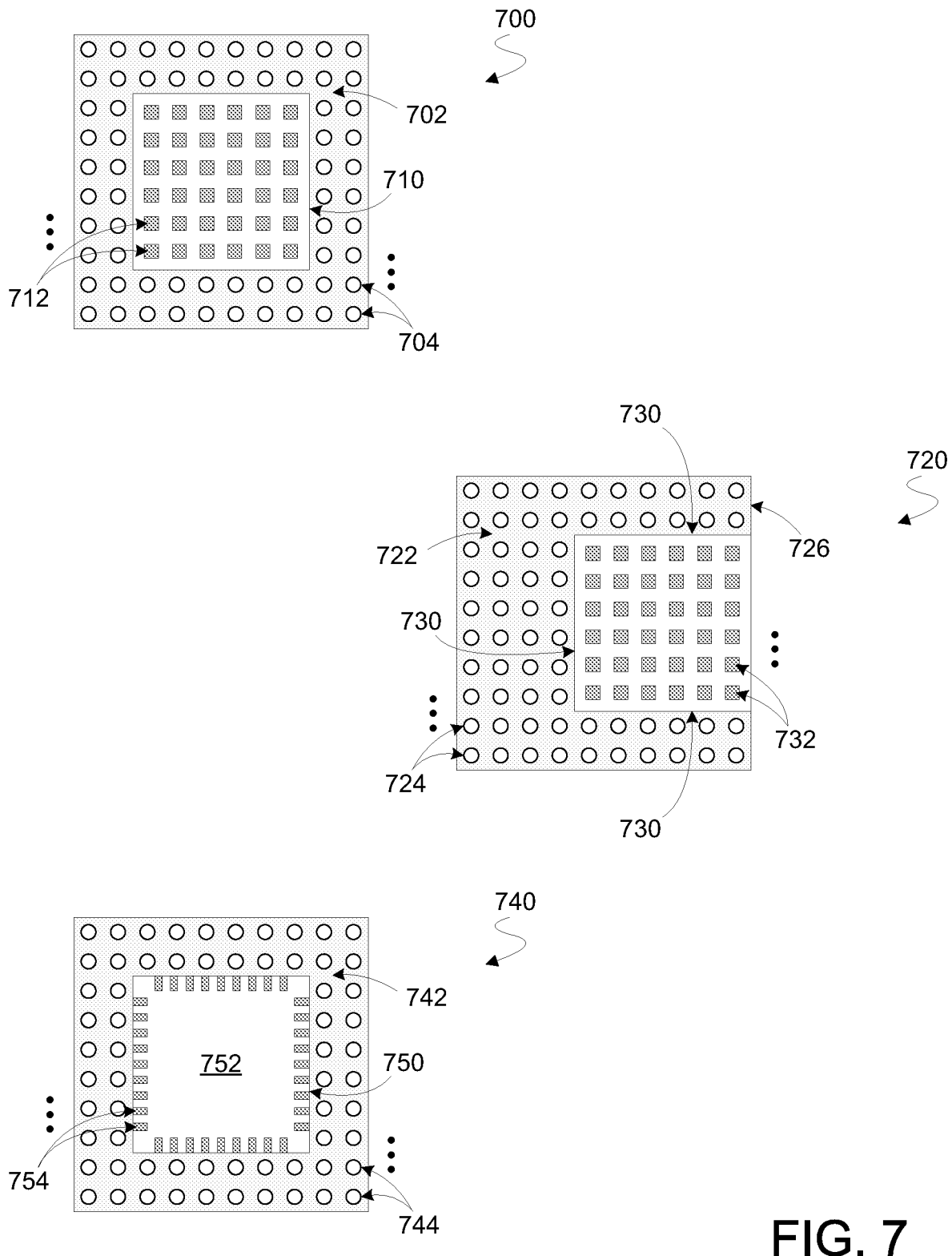
FIG. 7 is a side view illustrating elements of a packaged device according to an embodiment.

FIG. 7 illustrates respective elements of various packaged devices 700, 720, 740 each according to a corresponding embodiments. Some or all of packaged devices 700, 720, 740 may variously comprise features such as those of assembly 110, of one of devices 310, 450, 510, 650 and/or the like. In an embodiment, method 200 includes operations to fabricate one of packaged devices 700, 720, 740.

Device 700 may include a substrate—e.g., substrate 114—having disposed thereon structures to enable coupling of device 700 to a PCB or another packaged device. For example, a side 702 of such a substrate may accommodate one or more contacts 704 of a first hardware interface. In an embodiment, an interior edge 710 of side 704 defines at least in part a recess structure that, for example, forms a hole extending through the substrate. A floor of the recess structure may have formed thereon one or more contacts 712 of another hardware interface that is to couple one or more IC dies (not shown) of packaged device 700 with one or more other IC die—e.g., where the one or more other IC die are included in (or alternatively, are to couple to) device 700.

Device 720 represents another embodiment wherein one or more contacts 724 of a first hardware interface are disposed on a side 722 of a substrate such as substrate 114. Edges 730 of side 722 may define a recess structure that has formed therein one or more contacts 732 (e.g., one or more contacts 124) of another hardware interface. In the embodiments of device 700, side 702 surrounds a perimeter of the recess structure that has one or more contacts 712 disposed therein. By contrast, the recess structure defined at least in part by edges 730 extends to an edge 726—e.g., where side 722 extends only partially around the recess structure of device 720. For example, the recess structure may be defined in part by edges 730 that form a notch at edge 726.

Device 740 represents another embodiment wherein one or more contacts 744 of a first hardware interface are disposed on a side 742 of a substrate. Edges 750 of side 742 may define a recess structure 752 that has formed therein one or more contacts 754 (e.g., one or more contacts 124) of another hardware interface. While devices 700, 720 variously illustrate embodiments wherein contacts are disposed on a floor of a recess structure, one or more contacts 754 are variously disposed in sidewalls of the recess structure formed by device 740.

Figure 8:
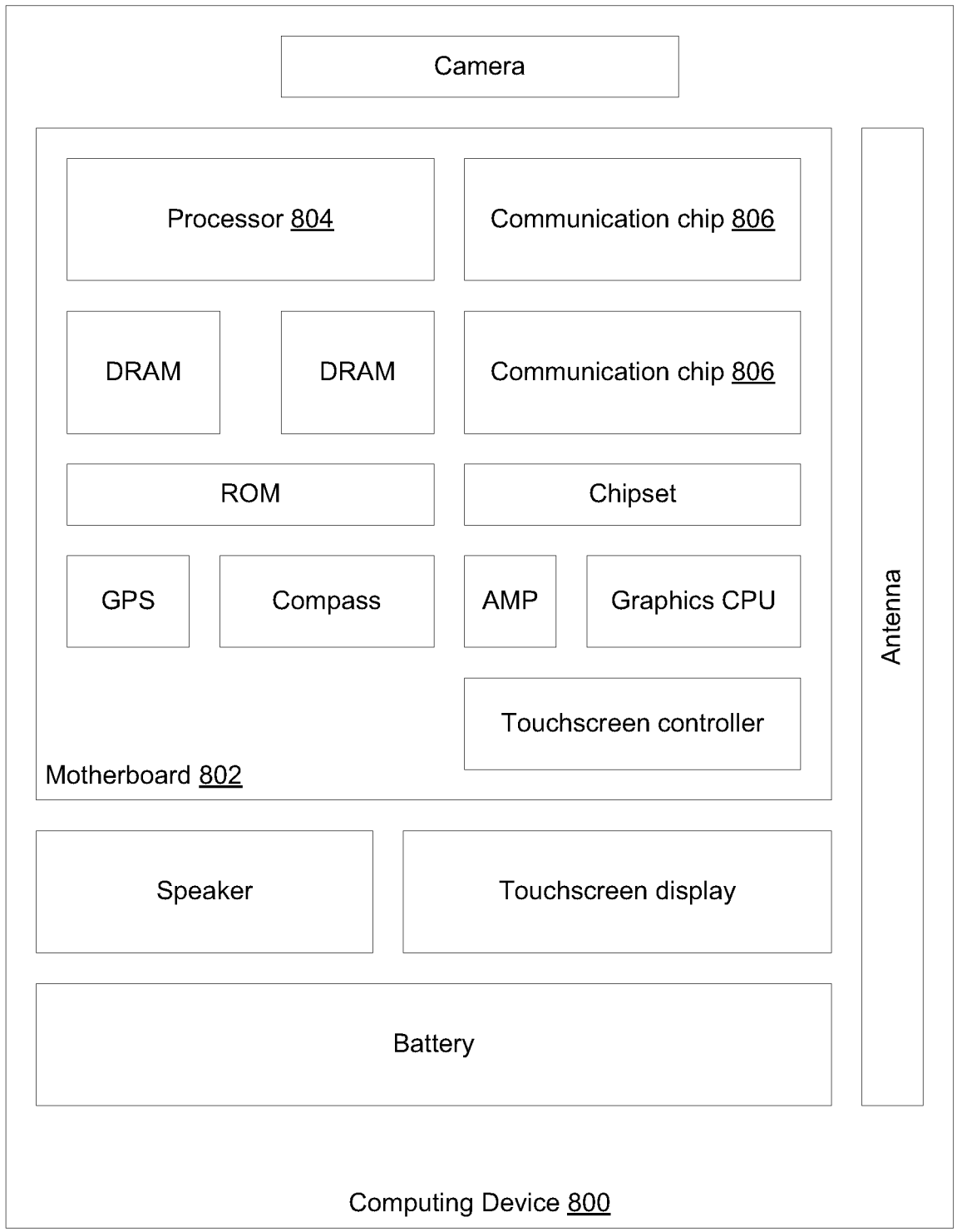
FIG. 8 illustrates a computing device in accordance with one embodiment.

FIG. 8 illustrates a computing device 800 in accordance with one embodiment. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. The term "processor" may refer to any device or portion of a device that processes electronic data from registers and/or memory to transform that electronic data into other electronic data that may be stored in registers and/or memory. The communication chip 806 also includes an integrated circuit die packaged within the communication chip 806.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Embodiments may be provided as a computer program product, or software, that may include a machine-readable medium having stored thereon instructions, which may be used to program a computer system (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 9:
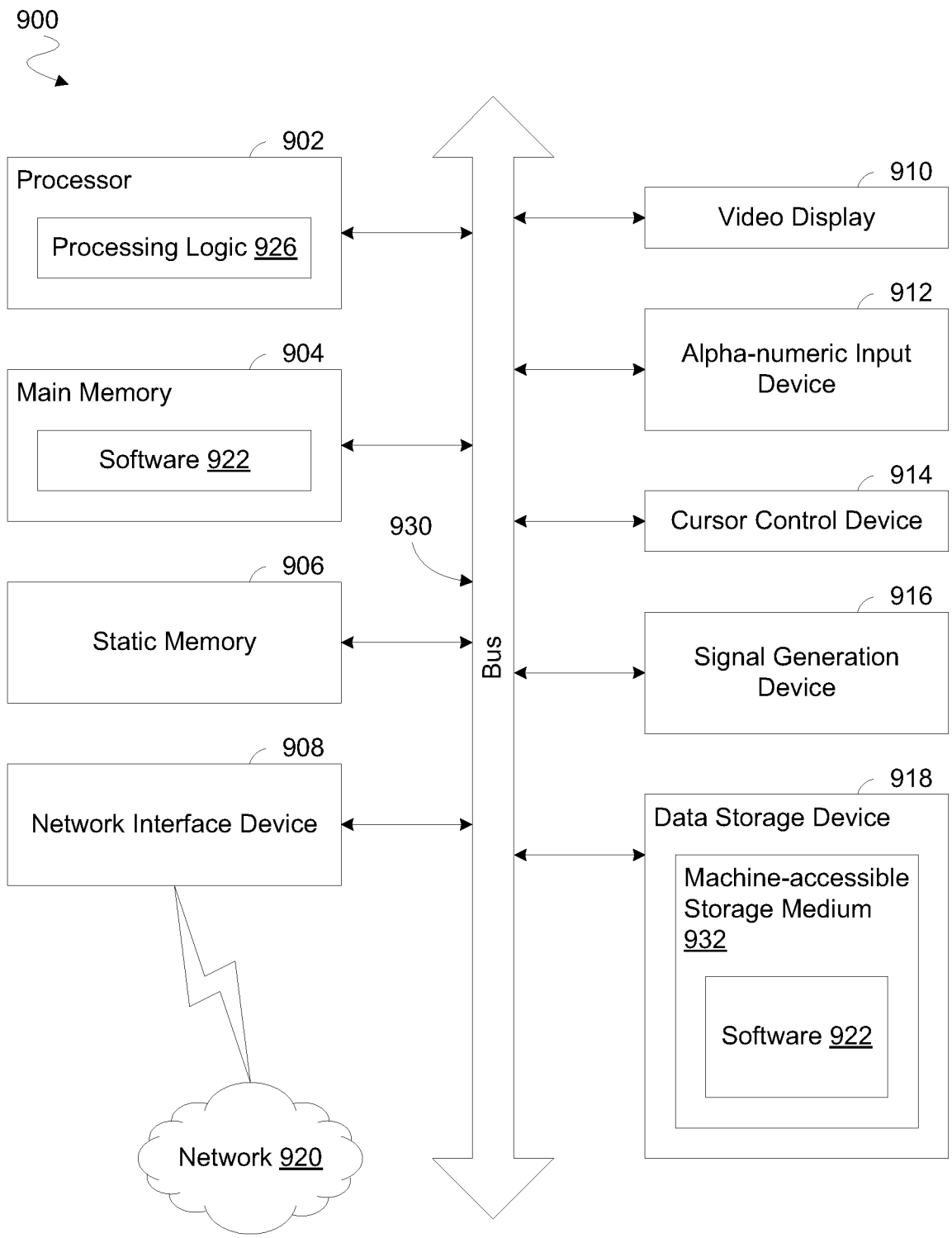
FIG. 9 illustrates a block diagram of an exemplary computer system, in accordance with an embodiment.

FIG. 9 illustrates a diagrammatic representation of a machine in the exemplary form of a computer system 900 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 900 includes a processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a secondary memory 918 (e.g., a data storage device), which communicate with each other via a bus 930.

Processor 902 represents one or more general-purpose processing devices such as a microprocessor, central processing unit, or the like. More particularly, the processor 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 902 may also be one or more special-purpose processing devices such as an application specific integrated circuit (ASIC), a field programmable gate array (FPGA), a digital signal processor (DSP), network processor, or the like. Processor 902 is configured to execute the processing logic 926 for performing the operations described herein.

The computer system 900 may further include a network interface device 908. The computer system 900 also may include a video display unit 910 (e.g., a liquid crystal display (LCD), a light emitting diode display (LED), or a cathode ray tube (CRT)), an alphanumeric input device 912 (e.g., a keyboard), a cursor control device 914 (e.g., a mouse), and a signal generation device 916 (e.g., a speaker).

The secondary memory 918 may include a machine-accessible storage medium (or more specifically a computer-readable storage medium) 932 on which is stored one or more sets of instructions (e.g., software 922) embodying any one or more of the methodologies or functions described herein. The software 922 may also reside, completely or at least partially, within the main memory 904 and/or within the processor 902 during execution thereof by the computer system 900, the main memory 904 and the processor 902 also constituting machine-readable storage media. The software 922 may further be transmitted or received over a network 920 via the network interface device 908.

While the machine-accessible storage medium 932 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of an embodiment. The term "machine-readable storage medium" shall accordingly be taken to include, but not be limited to, solid-state memories, and optical and magnetic media.

Figure 10:
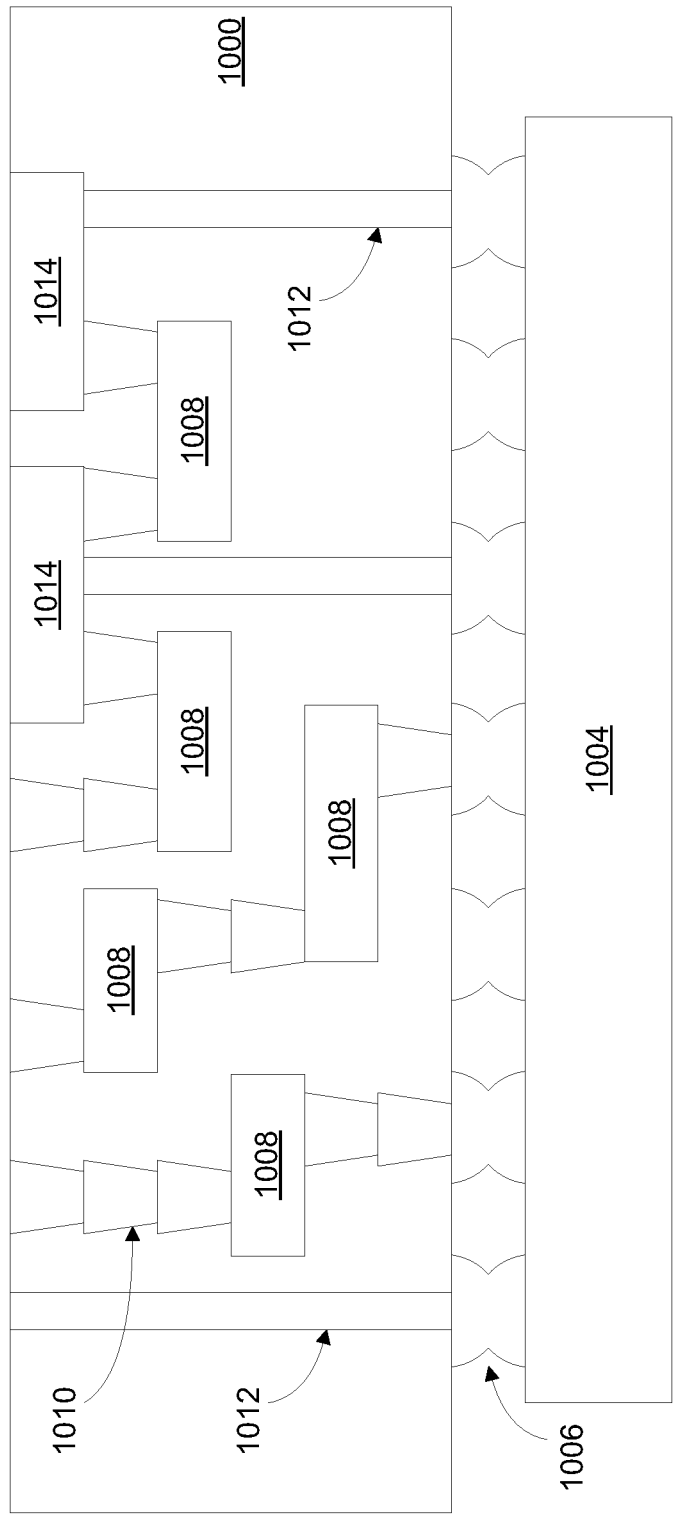
FIG. 10 is an interposer implementing one or more embodiments.

FIG. 10 illustrates an interposer 1000 that includes one or more embodiments. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002, 1004 are attached to opposing sides of the interposer 1000. In other embodiments, the first and second substrates 1002, 1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with some embodiments, apparatuses or processes disclosed herein may be used in the fabrication of interposer 1000.

Figure 11:
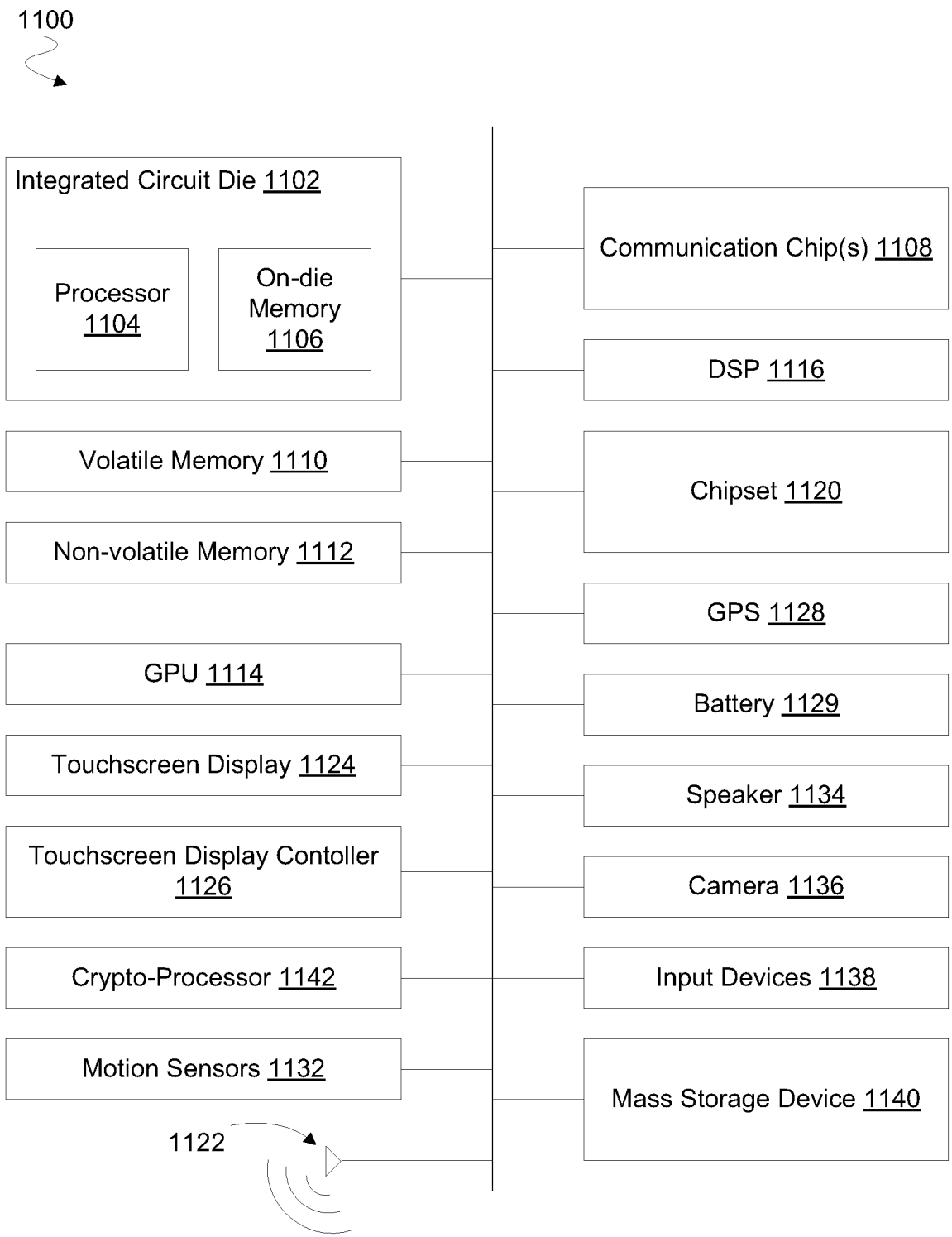
FIG. 11 is a computing device built in accordance with an embodiment.

FIG. 11 illustrates a computing device 1100 in accordance with one embodiment. The computing device 1100 may include a number of components. In one embodiment, these components are attached to one or more motherboards. In an alternate embodiment, these components are fabricated onto a single system-on-a-chip (SoC) die rather than a motherboard. The components in the computing device 1100 include, but are not limited to, an integrated circuit die 1102 and at least one communication chip 1108. In some implementations the communication chip 1108 is fabricated as part of the integrated circuit die 1102. The integrated circuit die 1102 may include a CPU 1104 as well as on-die memory 1106, often used as cache memory, that can be provided by technologies such as embedded DRAM (eDRAM) or spin-transfer torque memory (STTM or STTM-RAM).

Computing device 1100 may include other components that may or may not be physically and electrically coupled to the motherboard or fabricated within anSoC die. These other components include, but are not limited to, volatile memory 1110 (e.g., DRAM), non-volatile memory 1112 (e.g., ROM or flash memory), a graphics processing unit 1114 (GPU), a digital signal processor 1116, a crypto processor 1142 (a specialized processor that executes cryptographic algorithms within hardware), a chipset 1120, an antenna 1122, a display or a touchscreen display 1124, a touchscreen controller 1126, a battery 1129 or other power source, a power amplifier (not shown), a global positioning system (GPS) device 1128, a compass 1130, a motion coprocessor or sensors 1132 (that may include an accelerometer, a gyroscope, and a compass), a speaker 1134, a camera 1136, user input devices 1138 (such as a keyboard, mouse, stylus, and touchpad), and a mass storage device 1140 (such as hard disk drive, compact disk (CD), digital versatile disk (DVD), and so forth).

The communications chip 1108 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1108 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1108. For instance, a first communication chip 1108 may be dedicated to shorter range wireless communications such as Wi-Fi and Bluetooth and a second communication chip 1108 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. In various embodiments, the computing device 1100 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

In one implementation, a packaged device comprises a package material, one or more integrated circuit (IC) die disposed within the package material, and a first substrate coupled to the one or more IC die and disposed in or on the package material, wherein an opposing sidewalls of the first substrate define at least in part a recess structure extending from a first side of the first substrate and through the first substrate, the recess structure to receive a unit including another IC die. The packaged device further comprises a first hardware interface to couple the packaged device to a second device, the first hardware interface including first contacts disposed on the first side of the first substrate, and a second hardware interface to couple the one or more IC die to the other IC, the second hardware interface including second contacts disposed in the recess structure.

In another embodiment, the recess structure forms a hole extending from the first side of the first substrate and through the first substrate. In another embodiment, the packaged device further comprises a second substrate extending across the recess structure, wherein the second contacts are disposed on a side of the second substrate. In another embodiment, the packaged device further comprises the unit. In another embodiment, a portion of the unit crosses a plane of the first side. In another embodiment, the second substrate comprises an interposer.

In another embodiment, the first substrate includes an interposer. In another embodiment, the first substrate is disposed within the package material. In another embodiment, the second device is a printed circuit board. In another embodiment, the second device is a packaged device. In another embodiment, the second contacts are disposed on a floor of the recess structure. In another embodiment, the second contacts are disposed on a sidewall of the recess structure. In another embodiment, while the second interface is to couple to the unit, a portion of the unit crosses a plane of the first side.

In another implementation, a method for fabricating a packaged device comprises coupling a first substrate to one or more integrated circuit (IC) die, packaging the one or more IC die in a package material, wherein the package material is disposed on the first substrate, and forming a recess structure extending from a first side of the first substrate and through the first substrate, wherein opposing sidewalls of the first substrate define the recess structure at least in part. The method further comprises disposing first contacts of a first hardware interface on the first side of the first substrate, and disposing second contacts of a second hardware interface in the recess structure.

In an embodiment, forming the recess structure includes forming a hole extending from the first side of the first substrate and through the first substrate. In another embodiment, disposing the second contacts in the recess structure includes disposing the second contacts on a second substrate extending across the recess structure. In another embodiment, the second substrate comprises an interposer. In another embodiment, the first substrate includes an interposer. In another embodiment, the second device is a printed circuit board. In another embodiment, the second device is a packaged device. In another embodiment, disposing the second contacts includes disposing one or more contacts on a floor of the recess structure. In another embodiment, disposing the second contacts includes disposing one or more contacts on a sidewall of the recess structure. In another embodiment, the method further comprises coupling a unit to the second contacts, the unit including another IC die, wherein, while the unit is coupled to the second contacts, a portion of the unit extends across a plane of the first side.

In another implementation, a system comprises a first packaged device including a package material, one or more integrated circuit (IC) die disposed within the package material, and a first substrate coupled to the one or more IC die and disposed in or on the package material, wherein an opposing sidewalls of the first substrate define at least in part a recess structure extending from a first side of the first substrate and through the first substrate, the recess structure to receive a unit including another IC die. The first packaged device further comprises a first hardware interface including first contacts disposed on the first side of the first substrate, and a second hardware interface to couple the one or more IC die to the other IC, the second hardware interface including second contacts disposed in the recess structure. The system further comprises a printed circuit board coupled to the first packaged device via the first hardware interface, In an embodiment, the first packaged device further comprises a second substrate extending across the recess structure, wherein the second contacts are disposed on a side of the second substrate. In another embodiment, the first packaged device further comprises the unit. In another embodiment, a portion of the unit crosses a plane of the first side. In another embodiment, the system further comprises a second packaged device coupled to the first packaged device via the second contacts. In another embodiment, the recess structure forms a hole extending from the first side of the first substrate and through the first substrate. In another embodiment, the first substrate includes an interposer. In another embodiment, the first substrate is disposed within the package material. In another embodiment, the second contacts are disposed on a floor of the recess structure. In another embodiment, the second contacts are disposed on a sidewall of the recess structure.

Techniques and architectures for providing a packaged device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A packaged device comprising:
a first package material, the first package material having a first widest lateral width;
one or more integrated circuit (IC) dies disposed within the first package material;
a first substrate coupled to the one or more IC dies and disposed in or on the first package material, wherein an opposing sidewalls of the first substrate define at least in part a recess structure extending from a first side of the first substrate and through the first substrate, the recess structure to receive a unit including another IC die, and the first substrate having a second widest lateral width, the second widest lateral width the same as the first widest lateral width;

an active or passive component on the first substrate and laterally spaced apart from the one or more IC dies, the active or passive component included in the first package material;

a first hardware interface to couple the packaged device to a second device, the first hardware interface including first contacts disposed on the first side of the first substrate;

a second hardware interface to couple one of the one or more IC dies to the other IC die, the second hardware interface including second contacts disposed in the recess structure;

a second substrate extending across the recess structure, wherein the second contacts are disposed on a side of the second substrate, wherein the second substrate is laterally surrounded by the first package material, and wherein the second substrate has a lateral width greater than a lateral width of the other IC die; and a second package material on a bottom of the first substrate, on a bottom of the second substrate, and on a bottom of the other IC die, the second package material having a third widest lateral width the same as the second widest lateral width, the second package material laterally adjacent to the first contacts disposed on the first side of the first substrate, and the second package material laterally surrounding the other IC die.

2. The packaged device of claim 1, wherein the recess structure forms a hole extending from the first side of the first substrate and through the first substrate.

3. The packaged device of claim 1, further comprising a unit.

4. The packaged device of claim 3, wherein a portion of the unit crosses a plane of the first side.

5. The packaged device of claim 1, wherein the second substrate comprises an interposer.

6. The packaged device of claim 1, wherein the first substrate includes an interposer.

7. The packaged device of claim 1, wherein the first substrate is disposed within the first package material.

8. The packaged device of claim 1, wherein the second device is a printed circuit board.

9. The packaged device of claim 1, wherein the second device is a packaged device.

10. The packaged device of claim 1, wherein the second contacts are disposed on a floor of the recess structure.

11. The packaged device of claim 1, wherein the second contacts are disposed on a sidewall of the recess structure.

12. The packaged device of claim 1, wherein, while the second interface is to couple to the unit, a portion of the unit crosses a plane of the first side.

13. A method for fabricating a packaged device, the method comprising:

coupling a first substrate to one or more integrated circuit (IC) dies and to an active or passive component, the active or passive component laterally spaced apart from the one or more IC dies, the first substrate having a first widest lateral width;

packaging the one or more IC dies and the active or passive component and a second substrate in a first package material, wherein the first package material is disposed on the first substrate and is laterally surrounding the second substrate, the first package material having a second widest lateral width, the second widest lateral width the same as the first widest lateral width;

forming a recess structure extending from a first side of the first substrate and through the first substrate, wherein opposing sidewalls of the first substrate define the recess structure at least in part, wherein the second substrate is extending across the recess structure;

disposing first contacts of a first hardware interface on the first side of the first substrate;

disposing second contacts of a second hardware interface in the recess structure, wherein the second contacts are disposed on a side of the second substrate;

coupling a unit to the second contacts, the unit including another IC die coupled to one of the one or more IC dies, wherein the second substrate has a lateral width greater than a lateral width of the other IC die; and forming a second package material on a bottom of the first substrate, on a bottom of the second substrate, and on a bottom of the other IC die, the second package material having a third widest lateral width the same as the second widest lateral width, the second package material laterally adjacent to the first contacts disposed on the first side of the first substrate, and the second package material laterally surrounding the other IC die.

14. The method of claim 13, wherein forming the recess structure includes forming a hole extending from the first side of the first substrate and through the first substrate.

15. The method of claim 13, wherein disposing the second contacts includes disposing one or more contacts on a floor of the recess structure.

16. The method of claim 13, wherein disposing the second contacts includes disposing one or more contacts on a sidewall of the recess structure.

17. The method of claim 13, wherein, while the unit is coupled to the second contacts, a portion of the unit extends across a plane of the first side.

18. A system comprising:

a first packaged device including:

a first package material, the first package material having a first widest lateral width;

one or more integrated circuit (IC) dies disposed within the first package material;

a first substrate coupled to the one or more IC dies and disposed in or on the first package material, wherein an opposing sidewalls of the first substrate define at least in part a recess structure extending from a first side of the first substrate and through the first substrate, the recess structure to receive a unit including another IC die, and the first substrate having a second widest lateral width, the second widest lateral width the same as the first widest lateral width;

an active or passive component on the first substrate and laterally spaced apart from the one or more IC dies, the active or passive component included in the package material;

a first hardware interface including first contacts disposed on the first side of the first substrate; and a second hardware interface to couple one of the one or more IC dies to the other IC, the second hardware interface including second contacts disposed in the recess structure;

a second substrate extending across the recess structure, wherein the second contacts are disposed on a side of the second substrate, and wherein the second substrate is laterally surrounded by the first package material, and wherein the second substrate has a lateral width greater than a lateral width of the other IC die; and a second package material on a bottom of the first substrate, on a bottom of the second substrate, and on a bottom of the other IC die, the second package material having a third widest lateral width the same as the second widest lateral width, the second package material laterally adjacent to the first contacts disposed on the first side of the first substrate, and the second package material laterally surrounding the other IC die; and a printed circuit board coupled to the first packaged device via the first hardware interface.

19. The system of claim 18, further comprising the unit, wherein the unit is a second packaged device coupled to the first packaged device via the second contacts.

20. The system of claim 18, wherein the recess structure forms a hole extending from the first side of the first substrate and through the first substrate.

\* \* \* \* \*